United States Patent [19]

Mochizuki et al.

[11] Patent Number: 5,166,092
[45] Date of Patent: Nov. 24, 1992

[54] METHOD OF GROWING COMPOUND SEMICONDUCTOR EPITAXIAL LAYER BY ATOMIC LAYER EPITAXY

[75] Inventors: Kouji Mochizuki, Isehara; Nobuyuki Ohtsuka, Atsugi; Masashi Ozeki, Yokohama, all of Japan

[73] Assignee: Fujitsu Limited, Kawasaki, Japan

[21] Appl. No.: 608,602

[22] Filed: Oct. 30, 1990

Related U.S. Application Data

[63] Continuation of Ser. No. 302,651, Jan. 27, 1989, abandoned.

[30] Foreign Application Priority Data

Jan. 28, 1988 [JP] Japan .................................. 63-18393

[51] Int. Cl.$^5$ ..................... H01L 21/203; H01L 21/20
[52] U.S. Cl. ..................... 437/105; 437/107; 437/108; 437/112
[58] Field of Search ..................... 437/81, 86, 87, 105, 437/107, 108, 112

[56] References Cited

U.S. PATENT DOCUMENTS

4,058,430 11/1977 Suntola et al. ..................... 156/611

FOREIGN PATENT DOCUMENTS

| 132408 | 1/1985 | European Pat. Off. ............ 437/107 |
| 54-099561 | 8/1979 | Japan .................................. 437/107 |
| 62-270493 | 11/1987 | Japan . |
| 63-136616 | 6/1988 | Japan .................................. 437/107 |
| 1-123411 | 5/1989 | Japan .................................. 437/107 |
| 2198152 | 6/1988 | United Kingdom .................. 437/107 |

OTHER PUBLICATIONS

Mochizuki, K., et al., "Carbon Incorporation in GaAs Layer Grown by Atomic Layer Epitaxy", Journal of Crystal Growth, (1988), pp. 557-561.

Nishizawa et al., "Molecular Layer Epitaxy", J. Electrochem. Soc., vol. 132, May 1985, pp. 1197-1200.

Razeghi et al., "Monolayer Epitaxy . . . by Low-Pressure Metalorganic Chemical Vapor Deposition", Appl. Phys. Lett., vol. 51(26), Dec. 28, 1987, pp. 2216-2218.

Aoyagi et al., "Atomic-Layer Growth of GaAs . . . ", J. Vac. Sci. Technol., B 5(5), Sep./Oct. 1987, pp. 1460-1464.

Toriyama et al., "Lattice Vibration of Thin-Layered AlAs-GaAs Superlathices", Jpn. J. Appl. Phys., vol. 25, No. 12, Dec. 1986, pp. 1895-1901.

*Primary Examiner*—Olik Chaudhuri
*Assistant Examiner*—G. Fourson
*Attorney, Agent, or Firm*—Nikaido, Marmelstein, Murray & Oram

[57] ABSTRACT

A method of growing compound semiconductor epitaxial layer by an atomic layer epitaxy, comprises the steps of blowing on a predetermined surface a compound source material gas constituted by atoms having an ion polarity different from atoms constituting the predetermined surface so that the compound source material is adsorped on the predetermined surface in a non-decomposed state, and decomposing the adsorped compound source material on the predetermined surface into atoms constituting crystals at the predetermined surface so as to grow an atomic layer of atoms having the same ion polarity as the compound source material gas. The ion polarity of the atomic layer prevents adsorption of the compound source material after the atomic layer is grown.

20 Claims, 12 Drawing Sheets

METHOD OF GROWING COMPOUND SEMICONDUCTOR EPITAXIAL LAYER BY ATOMIC LAYER EPITAXY

This application is a continuation of application Ser. No. 302,651 filed Jan. 27, 1989, now abandoned.

BACKGROUND OF THE INVENTION

The present invention generally relates to methods of growing compound semiconductor epitaxial layer by an atomic layer epitaxy, and more particularly to a method of growing atomic layers of a compound semiconductor on a substrate by use of the atomic layer epitaxy.

A atomic layer epitaxy (hereinafter simply referred to as an ALE) is a method of growing a compound semiconductor epitaxial layer. When growing the compound semiconductor epitaxial layer, molecules including positive ions (cations) and molecules including negative ions (anions) are alternately supplied to a substrate so as to grow epitaxial layers in atomic monolayers. In order for an ideal ALE to be carried out, a source material used must have a self-limiting effect so that the material is adsorbed on the substrate up to a certain quantity, but no further adsorption of that material occurs when that certain quantity is reached.

Conventionally, there is an apparatus shown in FIG. 1 for growing a compound semiconductor epitaxial layer by ALE. An example of this type of apparatus is disclosed in Japanese Laid-Open Patent Application No. 62-270493. This type of apparatus utilizes an ALE deposition chamber which was originally used for a chemical vapor deposition (CVD). In FIG. 1, the apparatus generally has a reactor 1, a susceptor 2, a gas introducing part 4, a gate valve 5, a gas exhaust part 6, and a high-frequency coil 7 wound around the outer periphery of the reactor 1. A substrate 3 is placed on the susceptor 2.

When growing a layer by ALE using zinc sulfide (ZnS) as the compound source material, a zinc chloride ($ZnCl_2$) gas is introduced from the gas introducing part 4 as a Zn source material for a predetermined time to fill the inside of the reactor 1. Hence, as shown schematically in FIG. 2A, Zn compound molecules, including chlorine radicals, are adsorbed on the substrate 3. In FIG. 2A through 2C, a plain circular mark indicates a Zn atom, a rectangular mark indicates a Cl atom, a circular mark with a dot pattern indicates a S atom, and a triangular mark indicates a hydrogen radical.

When the adsorbed Zn compound molecules cover the surface of the substrate 3, a self-limiting effect occurs. Accordingly, no further Zn compound molecules are adsorbed and the growth of the Zn compound layer is stopped.

Next, a hydrogen sulfide ($H_2S$) gas is introduced from the gas introducing part 4 for a predetermined time. Hence, as shown schematically in FIG. 2B, S compound molecules including negative ions made up of hydrogen radicals and S atoms are adsorbed on the Zn compound molecule layer, and the hydrogen radicals of the S compound molecules and the chlorine radicals of the Zn compound molecules react. As a result, after a predetermined time, a S atomic layer 10 is formed on a Zn atomic layer 9 as shown schematically in FIG. 2C. Similarly thereafter, the Zn atomic layer and the S atomic layer are alternately grown until a ZnS layer is formed to a desired thickness.

Therefore, the self-limiting effect is conventionally obtained by supplying a compound source material having the self-limiting effect on a substrate surface.

However, compound source materials having such a self-limiting effect hardly exist in reality. For example, when growing gallium arsenide (GaAs) by ALE, it is possible to realize a state similar to that shown in FIG. 2A by using a Ga source material such as trimethylgallium (TMGa: $(CH_3)_3Ga$) and keeping the substrate temperature at a sufficiently low temperature, but a reaction time is very slow, at the growth surface such as that shown in FIG. 2B, realized by use of any As compound source material.

And, when growing the GaAs molecular layer on the substrate, the substrate temperature should be set to a sufficiently high temperature so as to decompose the Ga compound molecules adsorbed on the substrate into Ga atoms by the thermal energy of the substrate and then supply an As compound source material such as arsine ($AsH_3$) into the reactor 1.

But in this case, a gas stagnant layer 8 exists above the substrate 3 as shown in FIG. 1, and the source material gas must pass through the gas stagnant layer 8 in order to reach the substrate 3. Consequently, as shown schematically in FIG. 3, Ga molecules 11 made up of Ga atoms 11a and methyl radicals 11b are decomposed while passing through the gas stagnant layer 8 before reaching the substrate 3, and the decomposed Ga atoms 11a are adsorbed on the substrate 3. Because the Ga atoms 11a do not have the self-limiting effect, there is a problem in that the Ga atomic layer is not self-limited to a predetermined thickness.

FIG. 4 shows a relationship between a thickness of grown GaAs layer per material supply cycle and a flow (supply) time of TMGa gas at a substrate temperature $T_{sub}$ of 500° C. when the conventional method is employed. The flow time of the $AsH_3$ gas was kept constant. The thickness of the grown GaAs layer increases as the flow time t of the TMGa gas increases, and it is extremely difficult to control the thickness of the grown GaAs layer to a desired thickness of 2.83 Å corresponding to one molecular layer made up of one Ga atomic layer and one As atomic layer.

The decomposition of the Ga molecules which occurs when the TMGa gas passes through the gas stagnant layer 8 can be suppressed by reducing the substrate temperature $T_{sub}$ because the temperature of the gas stagnant layer 8 is reduced when the substrate temperature $T_{sub}$ is reduced. FIG. 5 shows a relationship between the thickness of grown GaAs layer per material supply cycle and a flow (supply) time of TMGa gas at a substrate temperature $T_{sub}$ of 400° C. when the conventional method is employed. The flow time of the $AsH_3$ gas is kept constant. One molecular layer having the desired thickness of 2.83 Å is obtained when the flow time t of the TMGa gas is greater than a certain value.

But in this case, the reaction of the TMGa gas and the $AsH_3$ gas, which occurs at the substrate surface, is slow because of the low substrate temperature $T_{sub}$, and the time it takes to grow the GaAs molecular layer in FIG. 5 is long compared to the case shown in FIG. 4. In addition, when the growth of the GaAs molecular layer is slow, there is a problem in that the crystal state of the grown GaAs molecular layer is unsatisfactory since unwanted impurities in the GaAs molecular layer increase with the growth time.

SUMMARY OF THE INVENTION

Accordingly, it is a general object of the present invention to provide a novel and useful method of a growing compound semiconductor epitaxial layer by atomic layer epitaxy (ALE) in which the problems described above are eliminated.

Another and more specific object of the present invention is to provide a method of growing a compound semiconductor epitaxial layer by an atomic layer epitaxy process, comprising a first step of blowing on a predetermined surface, a compound source material gas including atoms having an ion polarity different from atoms constituting the predetermined surface so that the compound source material is adsorbed on the predetermined surface in a non-decomposed state, and a second step of decomposing the adsorbed compound source material on the predetermined surface into atoms constituting crystals at the predetermined surface so as to grow an atomic layer of atoms having the same ion polarity as the compound source material gas, where the ion polarity of the atomic layer prevents adsorption of the compound source material after the atomic layer is grown. According to the method of the present invention, a compound source material supplied in excess will not be adsorped on the atomic layer. In other words, a substantial self-limiting effect is obtained by use of the selective adsorption characteristic of the compound source material. In addition, it is possible to grow the atomic layer at a relatively high temperature within a short time, and the crystal state of the grown epitaxial layer is satisfactory.

Still another object of the present invention is to provide the method described above wherein the first step blows the compound source material gas approximately perpendicularly to the predetermined surface. According to the method of the present invention, a gas stagnant layer will not be generated in a vicinity of the predetermined surface, thereby enabling the growth of a satisfactory epitaxial layer.

Other objects and further features of the present invention will be apparent from the following detailed description when read in conjunction with the accompanying drawings.

DETAILED DESCRIPTION

First, a description will be given of the operating principle of the present invention, by referring to FIG. 6. The method of growing compound semiconductor epitaxial layer by ALE according to the present invention basically has first and second steps which may be repeated alternately to grow a compound semiconductor epitaxial layer including a plurality of atomic layers.

In the first step, a compound source material gas is blown on a substrate or a previously formed atomic layer of an ion polarity different from that of atoms constituting the compound source material gas. As a result, the compound source material gas is not decomposed and the compound source material is adsorbed on the substrate or the previously formed atomic layer.

Then, in the second step, the adsorbed compound source material is decomposed into atoms which form crystals by the heat of the substrate, and an atomic layer of an ion polarity identical to that of the adsorbed compound source material is formed on the substrate or the previously formed atomic layer. The compound source material gas reaching the substrate after the atomic layer is formed on the substrate or the previously formed atomic layer is prevented from being adsorbed due to the ion polarities of the newly formed atomic layer and the compound source material gas.

Therefore, it is possible to grow on the substrate a compound semiconductor epitaxial layer by carrying out the first and second steps for respective compound source material gases.

When the compound source material gas includes positive ions, the compound source material is hardly adsorbed on an atomic layer of positive ions but is adsorped on an atomic layer of negative ions. Similarly, when the compound source material gas includes negative ions, the compound source material is hardly adsorbed on an atomic layer of negative ions but is adsorbed on an atomic layer of positive ions. In other words, when newly forming an atomic layer of a compound source material on a previously formed atomic layer, the compound source material has a selective adsorption characteristic dependent on the polarity of the ions included in the compound source material constituting the newly formed atomic layer and the polarity of the ions included in the compound source material constituting the previously formed atomic layer. The present invention effectively utilizes this selective adsorption characteristic of the compound source material when growing the compound semiconductor epitaxial layer by ALE.

Figure 6:
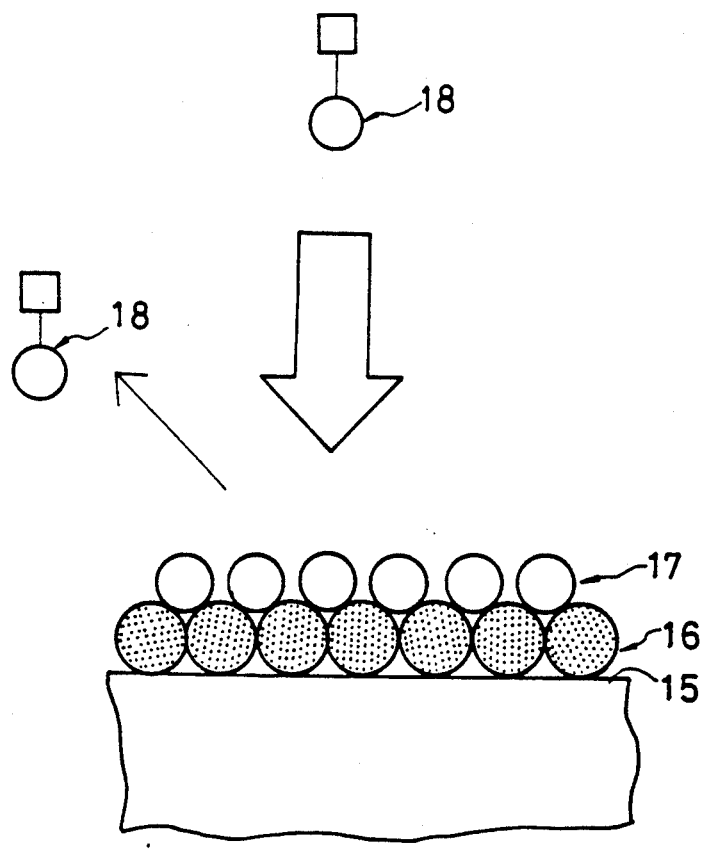
FIG. 6 is a schematic diagram for explaining an operating principle of the present invention.

FIG. 6 is a schematic diagram for explaining the operating principle of the present invention. As shown in FIG. 6, a first compound source material gas includes negative ions is applied to the first and second steps described above so as to epitaxially grow a first atomic layer 16 on a substrate 15. Thereafter, a second compound source material gas 18 including positive ions is applied to the first and second steps so as to epitaxially grow a second atomic layer 17 on the first atomic layer 16 by use of the selective adsorption characteristic.

After the entire surface of the first atomic layer 16 is covered by the second atomic layer 17, the second compound source material gas 18 which is supplied in excess reaches the second atomic layer 17 without being decomposed. But the second compound source material gas 18 which includes the positive ions will not be adsorbed on the second atomic layer 17 which is also constituted by the positive ions because of the selective adsorption characteristic. Accordingly, even when the second compound source material 18 itself does not have the self-limiting effect, it is possible to stop the adsorption of the second compound source material gas 18 which is supplied in excess on the second atomic layer 17.

On the other hand, when the first step supplies the first compound source material gas including the negative ions on the second atomic layer 17, the compound molecules of the first compound source material gas are adsorbed on the second atomic layer 17 which is constituted by the positive ions due to the selective adsorption characteristic. The compound molecules of the first compound source material gas are decomposed by the second step into an atomic layer of the atoms included in the first compound source material gas, and for this reason, it is possible to stop the adsorption of the first compound source material gas which is supplied in excess on the atomic layer even when the first compound source material gas is supplied in excess.

Next, a description will be given of an embodiment of an apparatus for growing the compound semiconductor epitaxial layer by the ALE in conformance with to an embodiment of the method according to the present invention. An apparatus shown in FIG. 7 generally has a chimney type low pressure reactor 20, a susceptor 21, a susceptor support pipe 23 made of quartz, selector valves 24 and 25, a gas mixer 26, and a controller 27. A substrate 22 is placed on the susceptor 21. The susceptor 21, the substrate 22 and the susceptor support pipe 23 are arranged within the reactor 20.

The selector valve 24 is supplied with a gas mixture of TMGa including positive $Ga^+$ ions and hydrogen ($H_2$), and also $H_2$ gas. The selector valve 25 is supplied with a gas mixture of $AsH_3$ including $As^-$ ions and $H_2$, and also $H_2$ gas. In other words, the selector valves 24 and 25 are respectively supplied with two kinds of gases. The controller 27 controls the selector valves 24 and 25 so as to selectively output one of the two kinds of gases supplied thereto. The gas mixer 26 mixes the gases outputted from the selector valves 24 and 25 and supplies a resulting gas mixture into the reactor 20.

Figure 7:
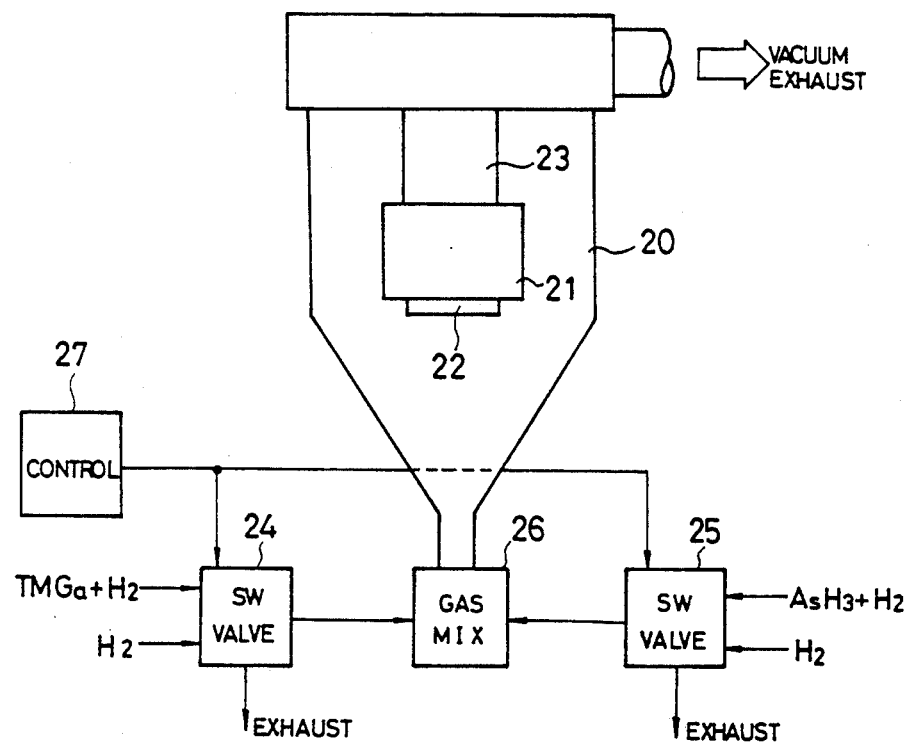
FIG. 7 generally shows an embodiment of an apparatus for growing a compound semiconductor epitaxial layer by ALE in conformance with an embodiment of the method according to the present invention.
Figure 8:
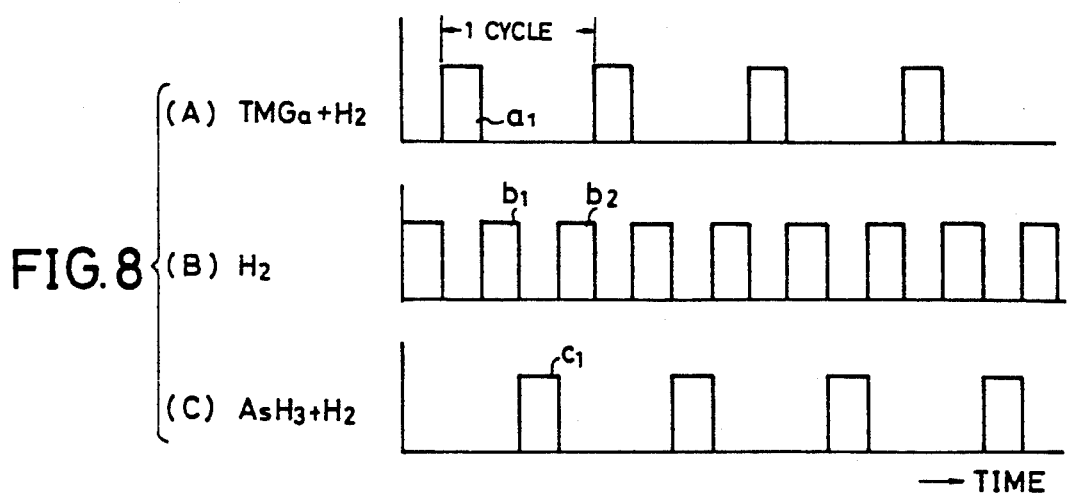
FIGS. 8(A) through 8(C) respectively are time charts for explaining supply of gases TMGa+$H_2$, $H_2$ and AsH+$H_2$ in the apparatus shown in FIG. 7.

FIGS. 8(A) through 8(C) are time charts for explaining supply of the gases $TMGa+H_2$, $H_2$ and $AsH_2+H_2$ in the apparatus shown in FIG. 7. During a time (pulse duration) $a_1$ shown in FIG. 8(A), the gas mixture $TMGa+H_2$ from the selector valve 24 and the $H_2$ gas from the selector valve 25 are supplied to the gas mixer 26. During a next time (pulse duration) $b_1$ shown in FIG. 8(B), the $H_2$ gases from the selector valves 24 and 25 are supplied to the gas mixer 26. In addition, during a next time (pulse duration) $c_1$ shown in FIG. 8(C), the gas mixture $AsH_3+H_2$ from the selector valve 25 and the $H_2$ gas from the selector valve 24 are supplied to the gas mixer 26. Thereafter, during a time (pulse duration) $b_1$ shown in FIG. 8(B), the $H_2$ gases from the selector valves 24 and 25 are supplied to the gas mixer 26. Similarly, the above described sequence of operations is repeated under the control of the controller 27.

The inside of the reactor 20 is under a low pressure. For this reason, the gas mixture $TMGa+H_2$ and the gas mixture $AsH_3+H_2$ which are alternately outputted from the gas mixer 26 are blown directly on the substrate 22 approximately perpendicularly to the substrate surface. Accordingly, no gas stagnant layer is generated as in the case of the conventional apparatus, and in addition, the TMGa reaches the substrate 22 without being decomposed. Hence, it is possible to make the TMGa, which is used as the Ga source material, have a self-limiting effect and enable a satisfactory growth of the compound semiconductor epitaxial layer by ALE.

Figure 9:
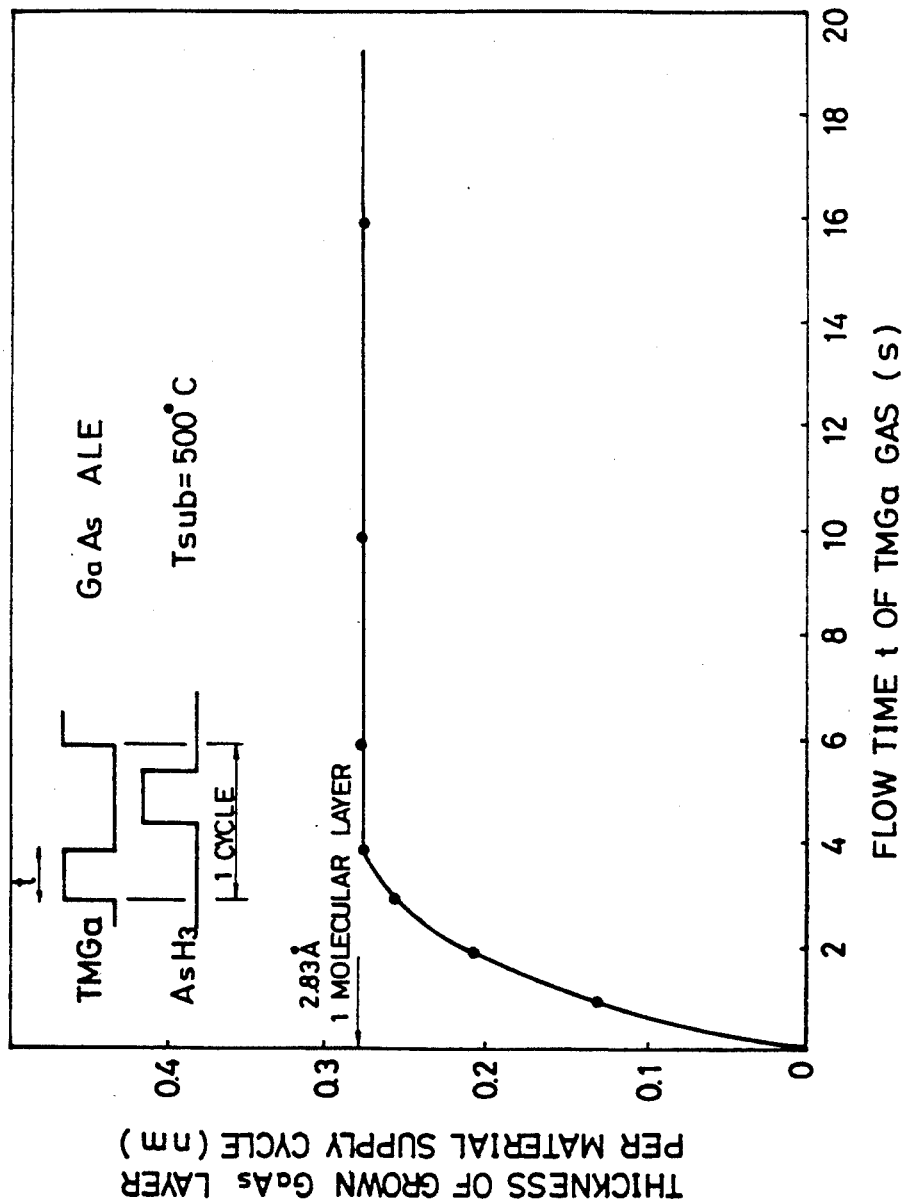
FIG. 9 is a graph showing a flow time of TMGa gas versus thickness of grown GaAs layer per material supply cycle characteristic at different substrate temperatures when the embodiment of the method according to the present invention is employed.

FIG. 9 shows a relationship between a thickness of grown GaAs layer per material supply cycle and a flow (supply) time of TMGa gas at a substrate temperature $T_{sub}$ of 500° C. when the embodiment of the method according to the present invention is employed. A flow time of the $AsH_3$ gas is kept constant. The thickness of the grown GaAs layer is controlled in approximately four seconds to a desired thickness of 2.83 Å corresponding to one molecular layer made up of one Ga atomic layer and one As atomic layer even though the substrate temperature $T_{sub}$ is 500° C. and relatively high. In other words, in such a range that the flow time t of the TMGa gas is longer than a predetermined time, the thickness of the grown GaAs layer is always the desired thickness corresponding to one molecular layer. This is an ideal characteristic in that the compound molecular layer can be grown to a desired thickness over a large area with a uniform concentration.

Figure 4:
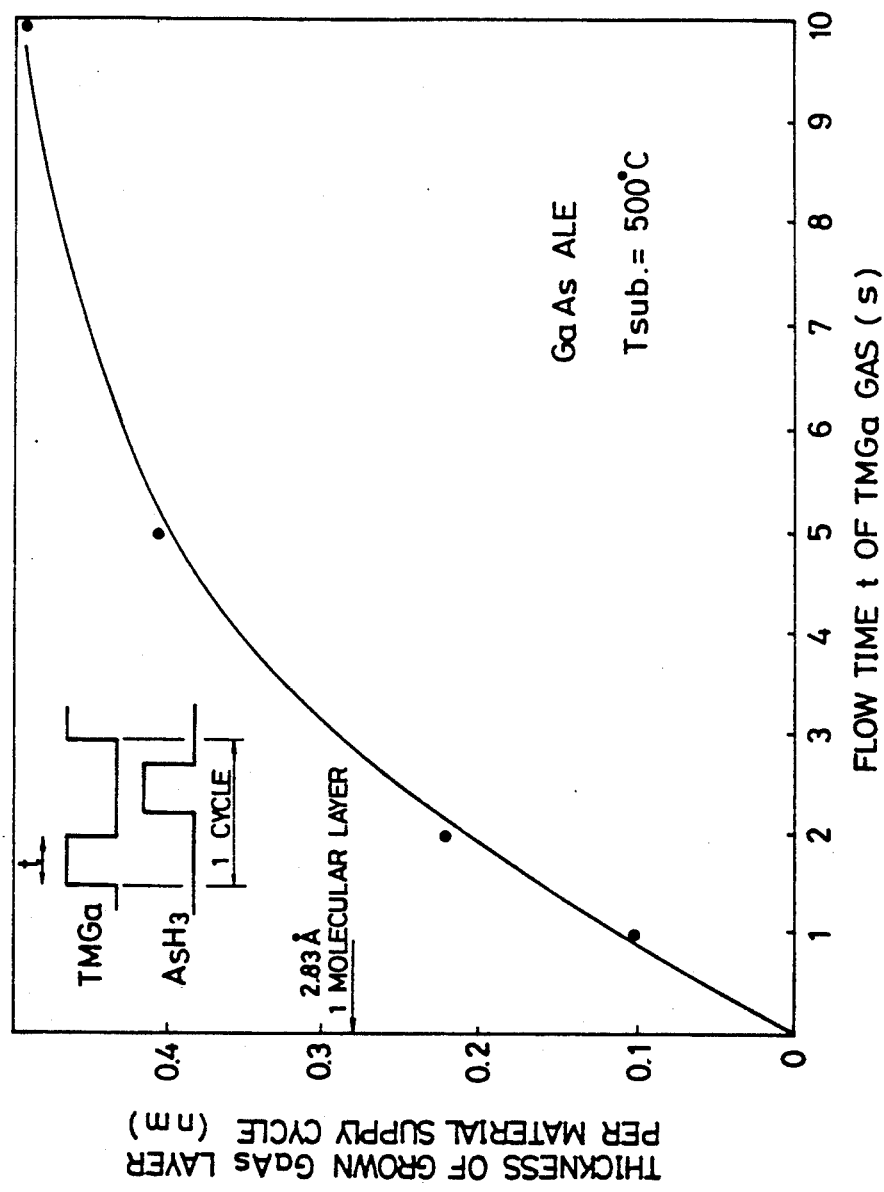
FIGS. 4 and 5 respectively show flow time of TMGa gas versus thickness of grown GaAs layer per material cycle characteristics at different substrate temperatures when the conventional method is employed.
Figure 5:
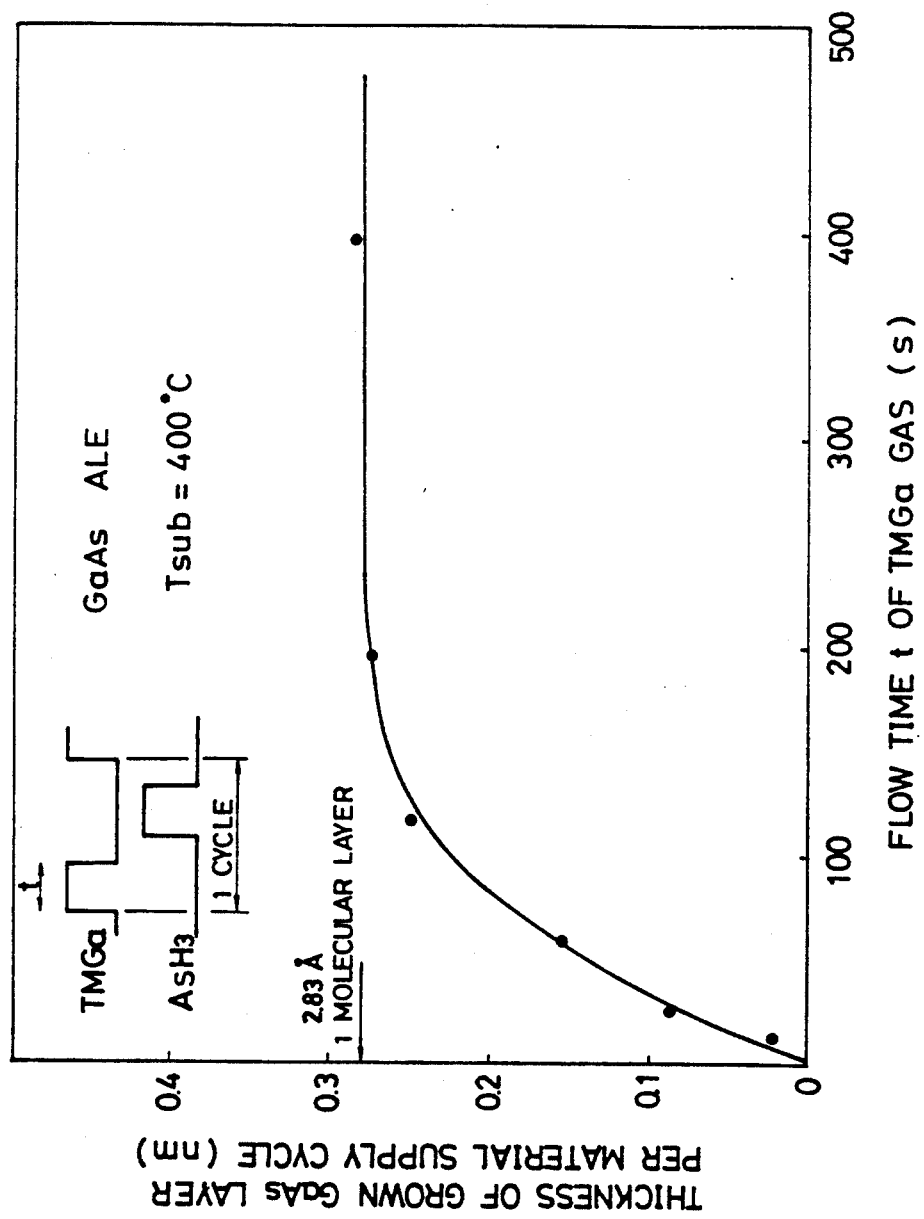

As described before in conjunction with FIG. 4, an ideal characteristic cannot be obtain at the relatively high substrate temperature $T_{sub}$ of 500° C. when the conventional method is employed. In addition, when the substrate temperature $T_{sub}$ is reduced to 400° C. so as to approximate the ideal characteristic when the conventional method is employed, it takes an extremely long time of 150 seconds or more to grow the compound molecular layer as shown in FIG. 5. But according to this embodiment, a satisfactory compound molecular layer can be grown at the relatively high substrate temperature, and furthermore, a satisfactory compound molecular layer can be grown within a short time (that is, short cycle time) compared to the conventional method.

Figure 10:
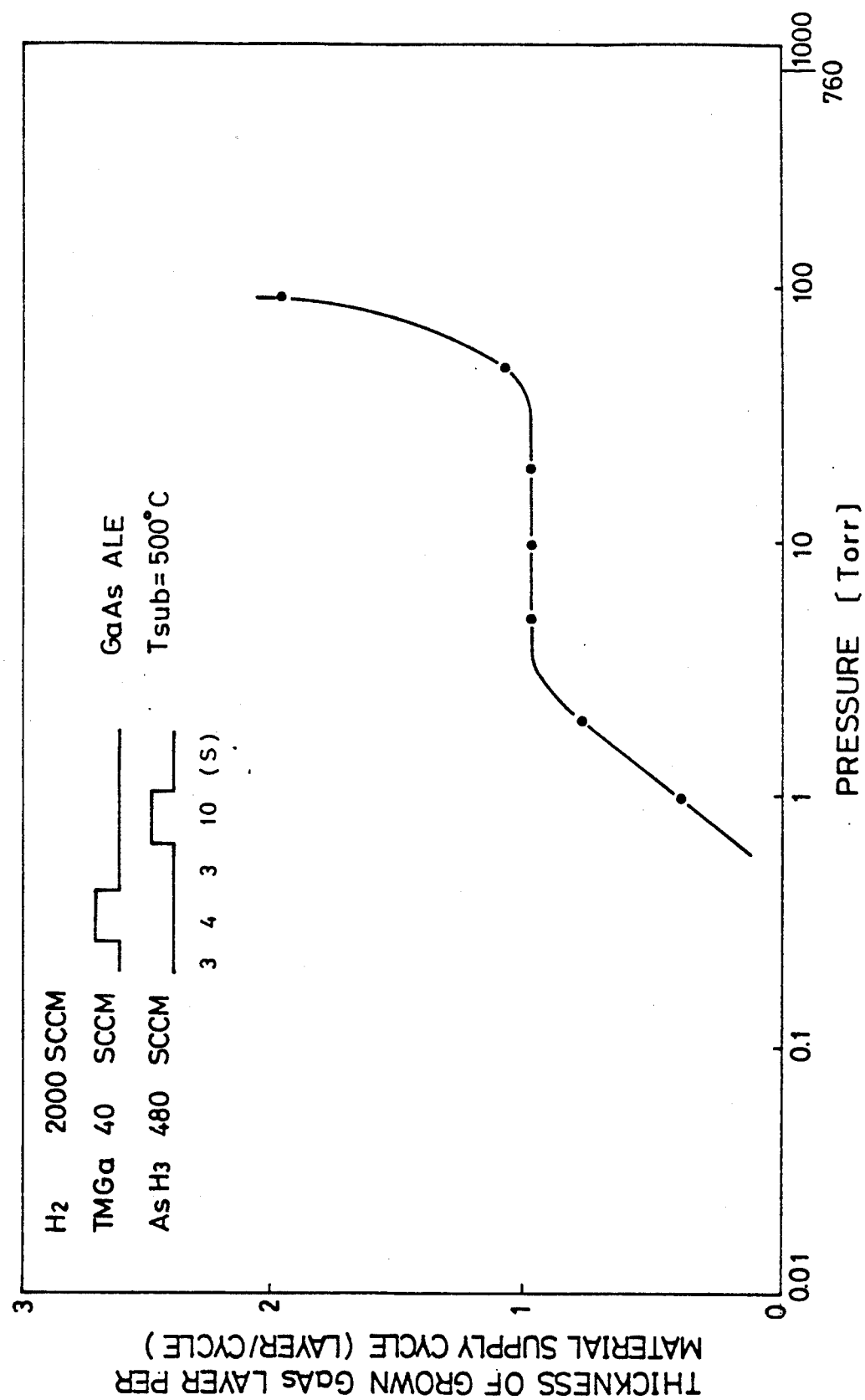
FIG. 10 shows a pressure versus thickness of grown GaAs layer per material supply cycle characteristic at the substrate temperature $T_{sub}$ of 500° C.

The present inventors have conducted various experiments to confirm the advantageous features of the present invention. FIG. 10 shows a pressure versus thickness of grown GaAs layer per material supply cycle characteristic at the substrate temperature $T_{sub}$ of 500° C. when the $H_2$ gas is supplied by the selector valve 25 for three seconds (2000 SCCM), the gas mixture $TMGa+H_2$ is supplied for four seconds by the selector valve 24 (40 SCCM), the $H_2$ gas is supplied by the selector valve 24 for three seconds (2000 SCCM), and the gas mixture $AsH_3+H_2$ is supplied for ten seconds by the selector valve 25 (480 SCCM). The pressure dependency of the thickness of the grown GaAs layer per material supply cycle can be seen from FIG. 10 which indicates that a satisfactory GaAs molecular layer is obtainable in a pressure range of approximately 7 Torr to 60 Torr.

Figure 11:
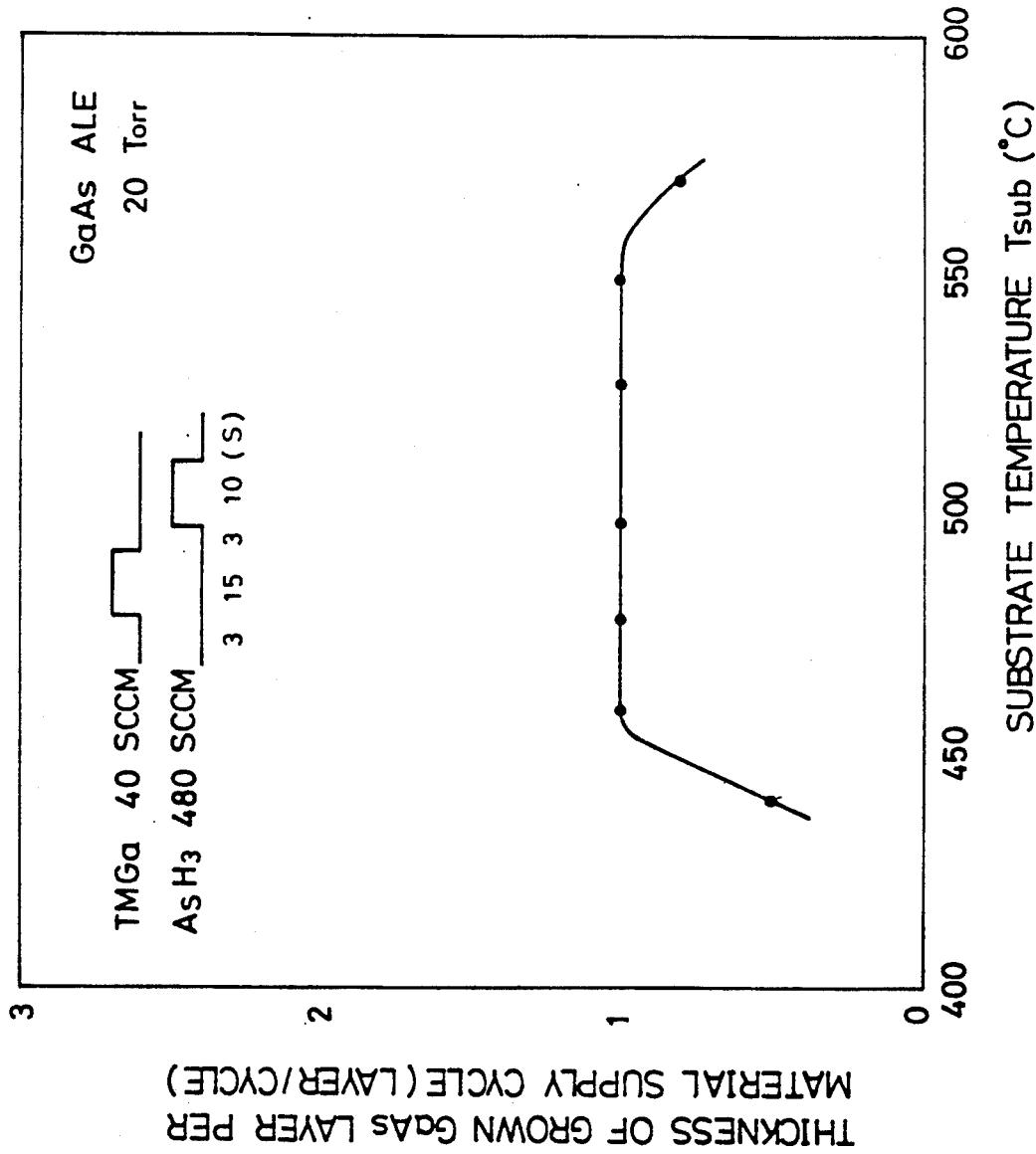
FIG. 11 shows a substrate temperature versus thickness of grown GaAs layer per material supply cycle characteristic at 20 Torr.

FIG. 11 shows a substrate temperature $T_{sub}$ versus thickness of grown GaAs layer per material supply cycle characteristic at 20 Torr when the TMGa+H$_2$, AsH$_3$+H$_2$ and H$_2$ are supplied from the selector valves 24 and 25 identically to the case shown in FIG. 10. The substrate temperature dependency of the thickness of the grown GaAs layer per material supply cycle can be seen from FIG. 11 which indicates that a satisfactory GaAs molecular layer is obtainable in a substrate temperature range of approximately 470° to 560° C.

Figure 1:
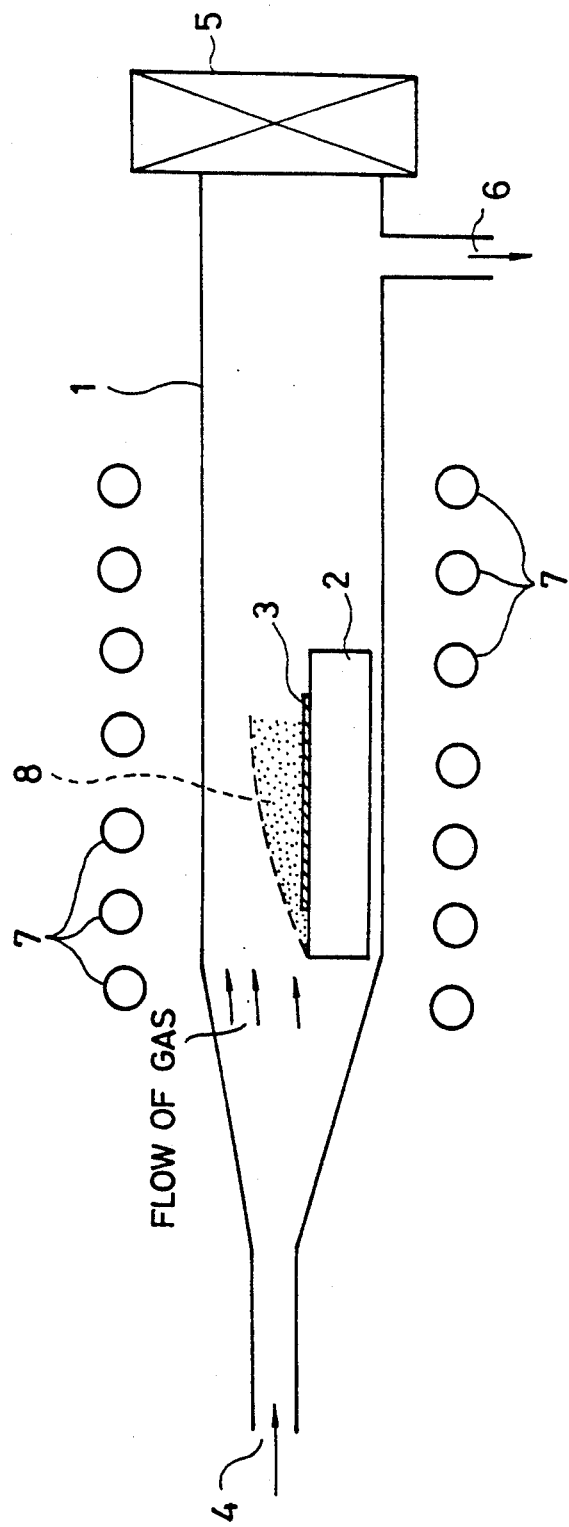
FIG. 1 is a cross sectional view showing an essential part of a conventional apparatus for growing a compound semiconductor epitaxial layer by ALE.
Figure 2A:
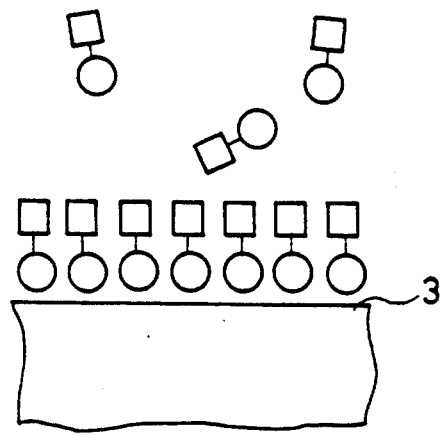
FIGS. 2A through 2C are schematic diagrams for explaining the growth of the ZnS molecular layer on the substrate by a conventional method.
Figure 2B:
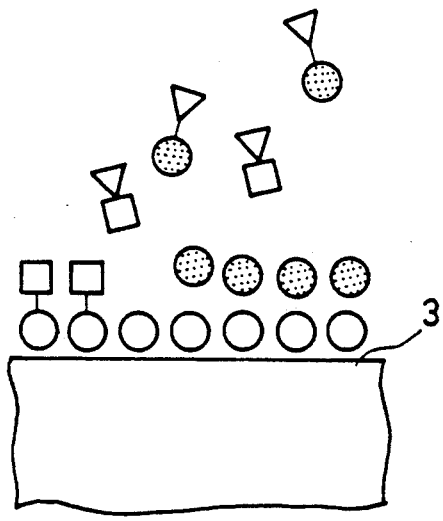
Figure 2C:
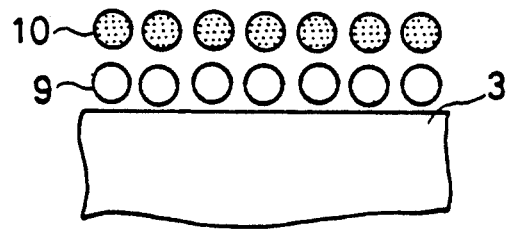
Figure 3:
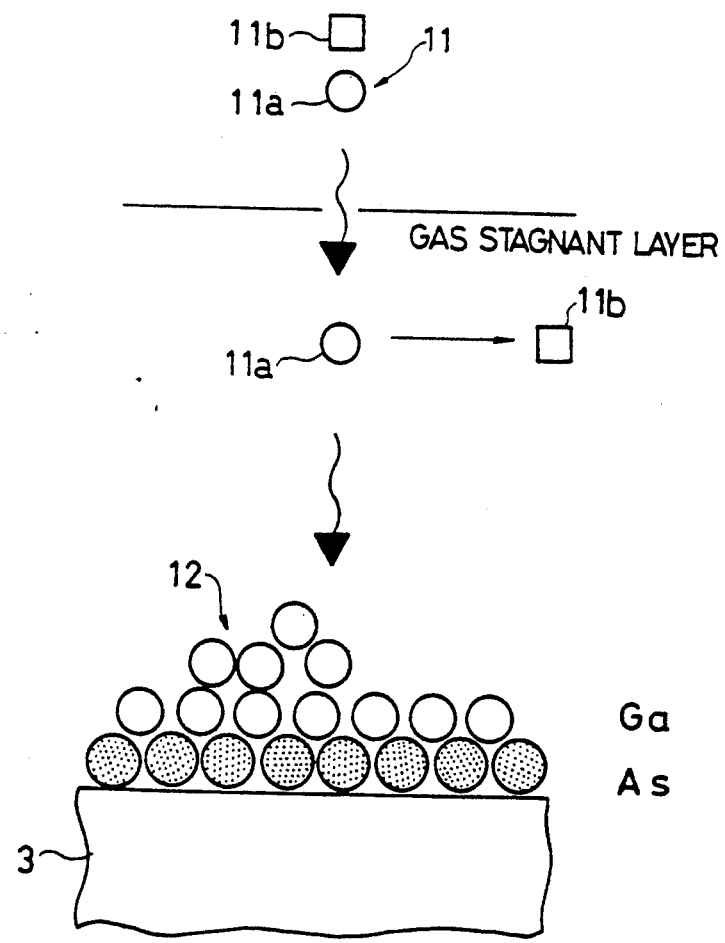
FIG. 3 is the schematic diagram for explaining the growth of a GaAs molecular layer on a substrate by a conventional method.
Figure 12:
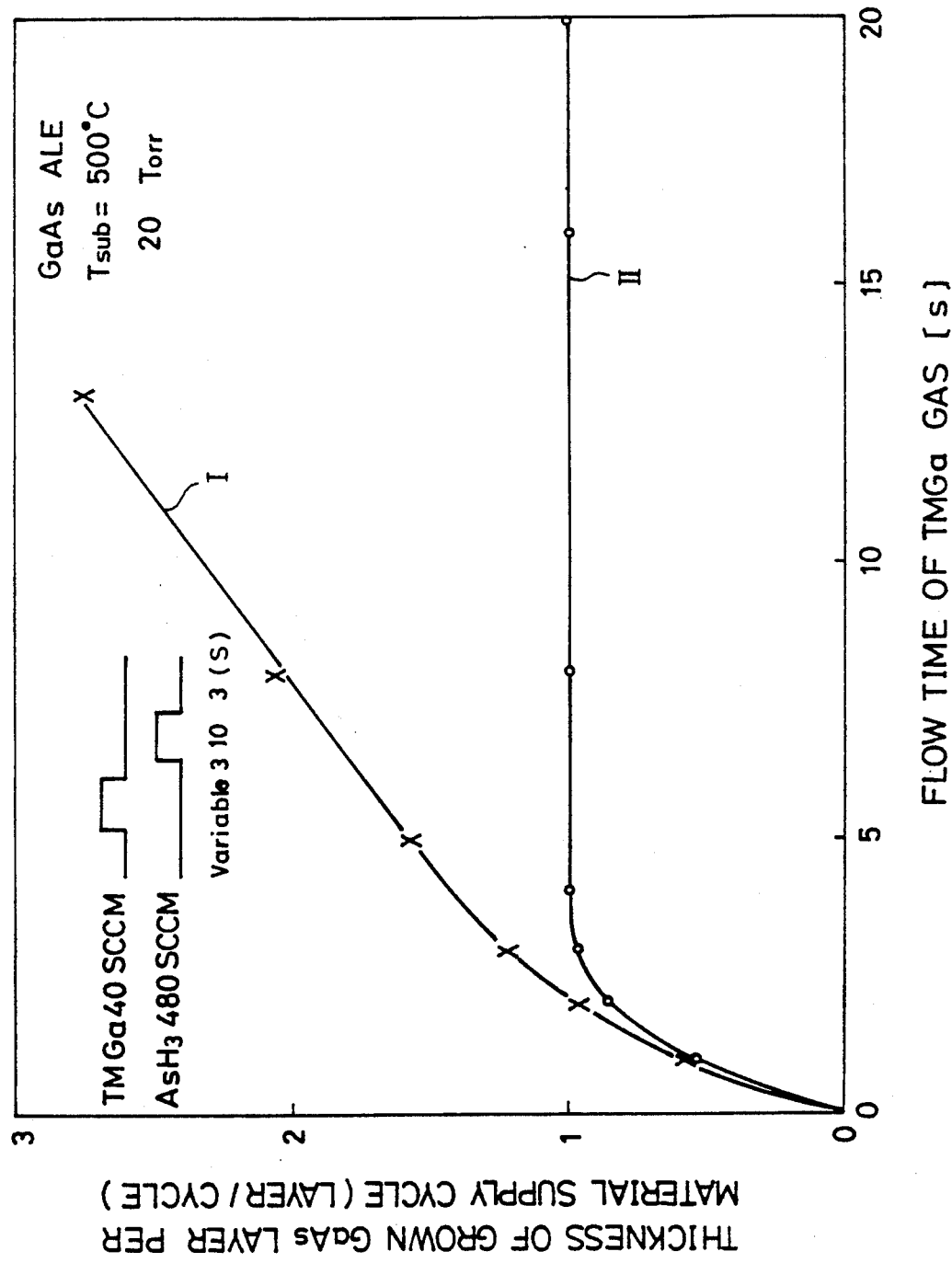
FIG. 12 shows a flow time of TMGa gas versus thickness of grown GaAs layer per material supply cycle characteristic for the conventional apparatus shown in FIG. 1 and the apparatus shown in FIG. 7 employed in the present invention.

For the sake of comparison, FIG. 12 shows a flow time of TMGa gas versus thickness of grown GaAs layer per material supply cycle characteristic for the conventional apparatus shown in FIG. 1 and the apparatus shown in FIG. 7 employed in the present invention. It may be seen from a characteristic I obtained with the conventional apparatus shown in FIG. 1 that the thickness of the grown GaAs layer increases as the flow time of the TMGa gas increases. But as may be seen from a characteristic II obtained with the apparatus shown in FIG. 7, the thickness of the grown GaAs layer remains at the thickness corresponding to one molecular layer after the flow time of the TMGa gas exceeds approximately four seconds.

When growing the GaAs molecular layer, it is possible to employ gases other than those used in the embodiment described above. For example, triethylgallium (TEGa) may be used as the source material to grow the Ga atomic layer, and trimethylarsenide (TMAs) may be used as the source material to grow the As atomic layer.

The method of the present invention is of course not limited to growing the GaAs molecular layer by the ALE, and other molecular layers may be grown by this method. For example, an aluminum (Al) atomic layer may be grown by use of triethylaluminum (TEA1) or trimethyl-aluminum (TMA1), and a phosphorus (P) atomic layer may be grown by use of (PH$_3$) or trimethylphosphide (TMP). The present invention may be applied to any epitaxial growth in atomic layers by alternately supplying a compound source material including positive ions such as Ga$^+$, Al$^+$, indium (In$^+$) and zinc (Zn$^+$), and a compound source material including negative ions such as arsenide (As$^-$), P$^-$, sulfur (S$^-$), and selenium (Se$^-$). In other words, the present invention is applicable to cases where the adsorbed molecules on the substrate need to decompose into atoms constituting an atomic layer on the substrate and the material supplied in excess will not be adsorped on the atomic layer.

Figure 13:
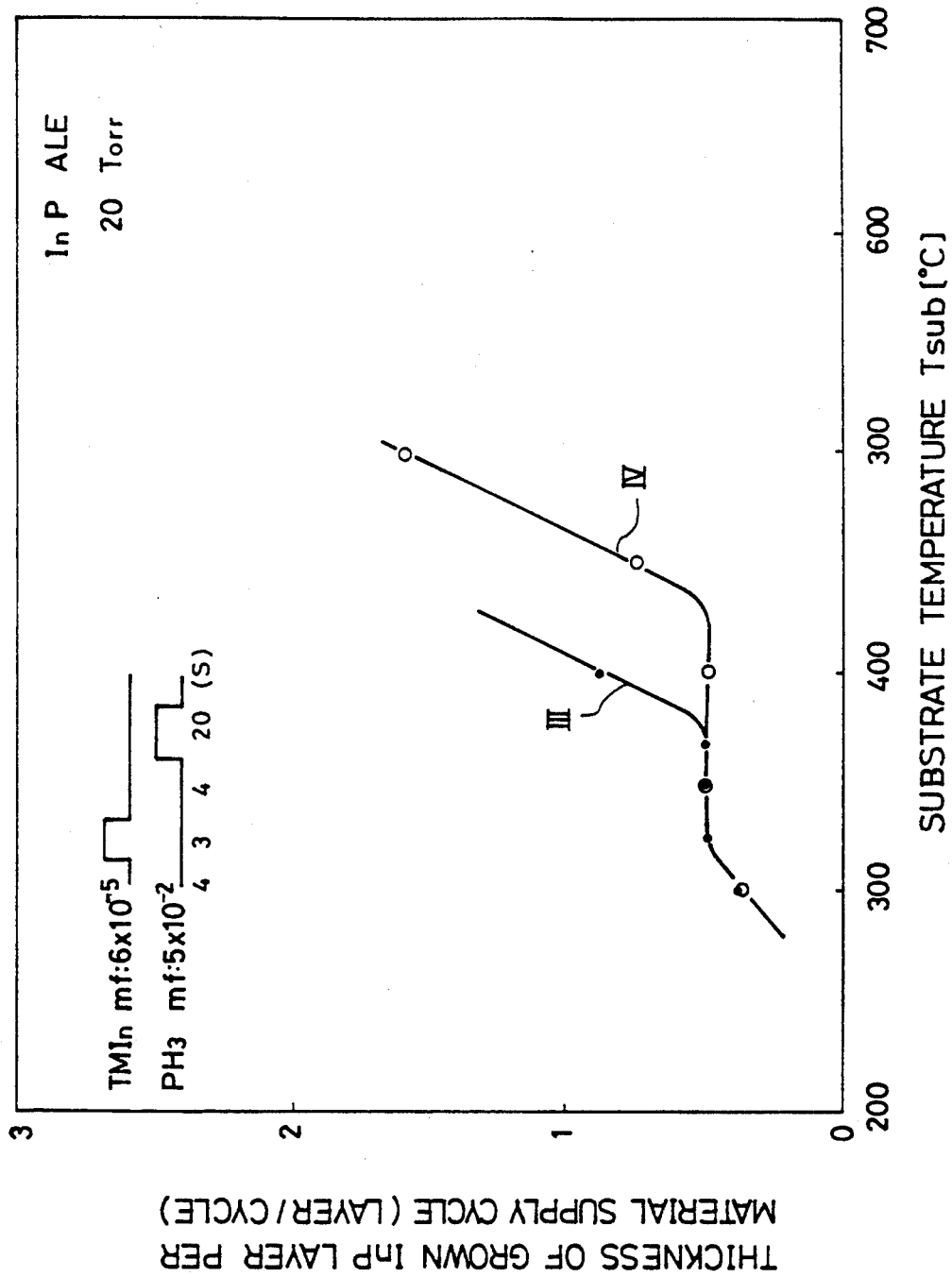
FIG. 13 shows a substrate temperature versus thickness of grown InP layer per material supply cycle characteristic at 20 Torr.

FIG. 13 shows a substrate temperature $T_{sub}$ versus thickness of grown indium phosphor (InP) layer per material supply cycle for the case where the conventional apparatus shown in FIG. 1 is employed and the apparatus shown in FIG. 7 is employed at 20 Torr. In this case, trimethylindium (TMIn) is used as the source material to grow the In atomic layer and PH$_3$ is used as the source material to grow the P atomic layer. It may be seen from a characteristic III obtained with the conventional apparatus shown in FIG. 1 that the thickness of the grown InP layer increases at substrate temperatures $T_{sub}$ of over approximately 450° C. But as may be seen from a characteristic IV obtained with the apparatus shown in FIG. 7, the thickness of the grown InP layer remains at the thickness corresponding to one molecular layer in a substrate temperature range of approximately 320° C. to 440° C. In other words, the InP molecular layer can be epitaxially grown at a relatively high substrate temperature $T_{sub}$ when compared to the conventional method.

Further, the present invention is not limited to these embodiments, but various variations and modifications may be made without departing from the scope of the present invention.

What is claimed is:

1. A method of growing a compound semiconductor epitaxial layer, by an atomic layer epitaxy process, which comprises:

A. providing a first surface of a first polarity on a substrate;

B. blowing a first source material gas, comprising a first compound containing at least a first of the elements of said compound semiconductor, including first ions having an ion polarity different from said first polarity, substantially perpendicularly onto said substrate surface in a substantially non-decomposed state;

C. adsorbing at least said first compound, onto said substrate surface;

D. decomposing, at a temperature of about 470° to 560° C. and a pressure of about 7 to 60 Torr., at least said adsorbed first compond, into atoms of at least said first element constituting crystals, at said substrate surface, so as to grow a substantially monatomic first layer having substantially the same ion polarity as the ions of said first source material gas comprising said first compound, while substantially preventing the adsorption of additional of said first compound after said first atomic layer has grown, whereby to produce a second surface of a different, second polarity than said first surface, over said first surface;

E. blowing a second source material gas, comprising a second compound containing at least a second of the elements of said compound semiconductor, including second ions having an ion polarity different from said second polarity, substantially perpendicularly onto said second surface in a substantially non-decomposed state;

F. adsorbing at least said second compound, onto said second surface;

G. decomposing, at a temperature of abourt 470° to 560° C. and a pressure of about 7 to 60 Torr., at least said adsorbed second compound, into atoms of at least said second element constituting crystals, at said second surface, so as to grow a substantially monatomic second layer having substantially the same ion polarity as the ions of said second source material gas comprising said second compound, while substantially preventing the adsorption of additional of said second compound after said second atomic layer has grown,
whereby to produce a third surface of a different polarity than said second surface, over said second surface;

H. reacting at least said first and second elements to form a first layer of said compound semiconductor on said surface;

I. supplying hydrogen gas into operative relationship with the layer of Step H as it is being grown;
wherein at least one of said first and second compounds contains at least one methyl group; and J. repeating steps A. through I. a number of times sufficient to grow said layer of said compound semiconductor of desired thickness.

2. A method as claimed in claim 1 wherein said first source material gas includes hydrogen gas.

3. A method as claimed in claim 1 wherein said second source material gas includes hydrogen gas.

4. A method as claimed in claim 1 wherein said first compound source material gas comprises negative ions, and said second compound source material gas comprises positive ions.

5. A method as claimed in claim 1 wherein said first compound is trimethyl gallium.

6. A method as claimed in claim 1 wherein said second compound is arsine.

7. A method as claimed in claim 1 wherein hydrogen gas is impined on said surfaces between each cycle.

8. A method as claimed in claim 1 wherein one of said elements comprises at least one of gallium, aluminum, zinc and indium.

9. A method as claimed in claim 8 wherein the other of said elements comprises at least one of arsenic, phosphorus, sulfur and selenium.

10. A method as claimed in claim 1 wherein said decomposition temperature is the temperature of said surface.

11. A method of growing a compound semiconductor epitaxial layer, by an atomic layer epitaxy process, which comprises:
  A. providing a first surface of a first polarity on a substrate;
  B. blowing a first source material gas, comprising a first compound containing at least a first of the elements of said compound semiconductor, including first ions having an ion polarity different from said first polarity, substantially perpendicularly onto said substrate surface in a substantially non-decomposed state;
  C. adsorbing at least said first compound, onto said substrate surface;
  D. decomposing, at least said adsorbed first compond, into atoms of at least said first element constituting crystals, at said substrate surface, so as to grow a substantially monatomic first layer having substantially the same ion polarity as the ions of said first source material gas comprising said first compound, while substantially preventing the adsorption of additional of said first compound after said first atomic layer has grown, whereby to produce a second surface of a different, second polarity than said first surface, over said first surface;
  E. blowing a second source material gas, comprising a second compound containing at least a second of the elements of said compound semiconductor, including second ions having an ion polarity different from said second polarity, substantially perpendicularly onto said second surface in a substantially non-decomposed state;
  F. adsorbing at least said second compound, onto said second surface;
  G. decomposing, at least said adsorbed second compound, into atoms of at least said second element constituting crystals, at said second surface, so as to grow a substantially monatomic second layer having substantially the same ion polarity as the ions of said second source material gas comprising said second compound, while substantially preventing the adsorption of additional of said second compound after said second atomic layer has grown, whereby to produce a third surface of a different polarity than said second surface, over said second surface;
  H. reacting at least said first and second elements to form a first layer of said compound semiconductor on said surface;
  I. supplying hydrogen gas into operative relationship with the layer of Step H as it is being grown; wherein at least one of said first and second compounds is an alkyl compound of said respsective element;
  J. repeating steps A. through I. a number of times sufficient to grow said layer of said compound semiconductor of desired thickness.

12. A method as claimed in claim 11 wherein said second source material gas includes hydrogen gas.

13. A method as claimed in claim 11 wherein said second source material gas includes hydrogen gas.

14. A method as claimed in claim 11 wherein said first compound source material gas comprises negative ions, and said second compound source material gas comprises positive ions.

15. A method as claimed in claim 11 wherein said first compound is trimethyl gallium.

16. A method as claimed in claim 11 wherein said second compound is arsine.

17. A method as claimed in claim 11 wherein hydrogen gas is impined on said surfaces between each cycle.

18. A method as claimed in claim 11 wherein one of said elements comprises at least one of gallium, aluminum, zinc and indium.

19. A method as claimed in claim 18 wherein the other of said elements comprises at least one of arsenic, phosphorus, sulfur and selenium.

20. A method as claimed in claim 11 wherein said decomposition temperature is the temperature of said surface.

* * * * *